(12) United States Patent
Tomita et al.

(10) Patent No.: US 12,523,544 B2
(45) Date of Patent: Jan. 13, 2026

(54) TEMPERATURE MEASUREMENT DEVICE

(71) Applicant: MEKTEC CORPORATION, Tokyo (JP)

(72) Inventors: Shunsuke Tomita, Tokyo (JP); Tomoki Kanayama, Tokyo (JP); Yuki Komuro, Tokyo (JP); Yusuke Hashimoto, Tokyo (JP)

(73) Assignee: MEKTEC CORPORATION, Tokyo (JP)

( * ) Notice: Subject to any disclaimer, the term of this patent is extended or adjusted under 35 U.S.C. 154(b) by 915 days.

(21) Appl. No.: 17/684,858

(22) Filed: Mar. 2, 2022

(65) Prior Publication Data

US 2022/0404214 A1   Dec. 22, 2022

(30) Foreign Application Priority Data

Jun. 21, 2021   (JP) .................................. 2021-102656

(51) Int. Cl.
| | |
|---|---|
| *G01K 7/22* | (2006.01) |
| *G01K 1/08* | (2021.01) |
| *G01K 1/14* | (2021.01) |
| *H01M 10/48* | (2006.01) |
| *H05K 1/02* | (2006.01) |
| *H05K 1/18* | (2006.01) |

(52) U.S. Cl.
CPC .................. *G01K 7/22* (2013.01); *G01K 1/08* (2013.01); *G01K 1/14* (2013.01); *H01M 10/486* (2013.01); *H05K 1/0298* (2013.01); *H05K 1/181* (2013.01); *H05K 1/189* (2013.01); *H01M 2220/20* (2013.01); *H05K 2201/10022* (2013.01)

(58) Field of Classification Search
None
See application file for complete search history.

(56) References Cited

U.S. PATENT DOCUMENTS

| | | | |
|---|---|---|---|
| 2013/0220785 A1* | 8/2013 | Mori ........................ | H01H 9/04 |
| | | | 200/302.1 |
| 2018/0134213 A1* | 5/2018 | Boiroux ................... | B60Q 3/80 |
| 2019/0178723 A1 | 6/2019 | Yanagida et al. | |
| 2020/0014083 A1* | 1/2020 | Matsushima ............ | G01K 1/14 |
| 2022/0042857 A1* | 2/2022 | Watanabe ............ | G01R 31/396 |

FOREIGN PATENT DOCUMENTS

| | | |
|---|---|---|
| JP | 6642301 B2 | 2/2020 |
| JP | 2020-087691 A | 6/2020 |

* cited by examiner

*Primary Examiner* — Erica S Lin
(74) *Attorney, Agent, or Firm* — Studebaker Brackett PLLC

(57) ABSTRACT

A temperature measurement device includes: a case fixed to a measurement target product; a flexible printed circuit board attached to the case; and a thermistor element mounting portion having a thermistor element to be electrically connected to a wiring provided on the flexible printed circuit board, the case has a holding portion for holding the thermistor element mounting portion and a support portion for supporting the holding portion, the holding portion is connected through a hinge portion to a case body provided with the support portion, and the holding portion is supported by the support portion in such a manner that the holding portion is folded back to bend the hinge portion.

6 Claims, 12 Drawing Sheets

TEMPERATURE MEASUREMENT DEVICE

CROSS-REFERENCE TO RELATED APPLICATION

This application claims priority from Japanese Patent Application No. 2021-102656 filed with the Japan Patent Office on Jun. 21, 2021, the entire content of which is hereby incorporated by reference.

BACKGROUND

1. Technical Field

One aspect of the present disclosure relates to a temperature measurement device.

2. Related Art

For example, a device configured to measure a battery temperature is provided for a battery mounted on, e.g., an electric vehicle or a hybrid vehicle and including multiple cells. Generally, a voltage monitoring device configured to monitor whether or not the voltages of the multiple cells are normal also has the function of measuring the temperature. In such a device, multiple wirings provided on a flexible printed circuit board are separately used for voltage monitoring and temperature measurement. Part of a region of the flexible printed circuit board provided at least with the voltage monitoring wirings is fixed to an upper side of a case attached to an upper portion of the battery. Meanwhile, a temperature measurement element (a thermistor element) fixed to the flexible printed circuit board is arranged immediately above the cell. Thus, a thermistor element mounting portion having the thermistor element is fixed to a lower side of the case. Since the size of the thermistor element mounting portion is small, the process of attaching the thermistor element mounting portion to a predetermined location after the case attached to the flexible printed circuit board has been turned over is burdensome.

Note that the above-described technique of the temperature measurement device is disclosed in, e.g., JP-A-2020-87691 and Japanese Patent No. 6642301.

SUMMARY

A temperature measurement device includes: a case fixed to a measurement target product; a flexible printed circuit board attached to the case; and a thermistor element mounting portion having a thermistor element to be electrically connected to a wiring provided on the flexible printed circuit board. The case has a holding portion for holding the thermistor element mounting portion and a support portion for supporting the holding portion, the holding portion is connected through a hinge portion to a case body provided with the support portion, and the holding portion is supported by the support portion in such a manner that the holding portion is folded back to bend the hinge portion.

DETAILED DESCRIPTION

Figure 1A:
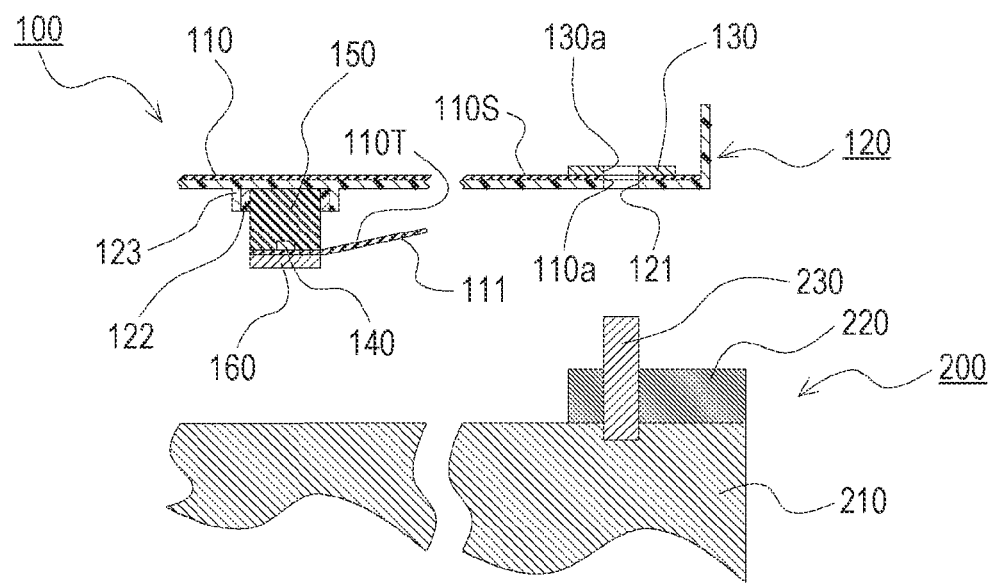
FIGS. 1A and 1B are views for describing the process of attaching a temperature measurement device according to a first embodiment of the present disclosure to a battery.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

One object of the present disclosure is to provide a temperature measurement device capable of improving workability upon attachment.

A temperature measurement device according to one aspect of the present disclosure (the present temperature measurement device) includes: a case fixed to a measurement target product; a flexible printed circuit board attached to the case; and a thermistor element mounting portion having a thermistor element to be electrically connected to a wiring provided on the flexible printed circuit board. The case has a holding portion for holding the thermistor element mounting portion and a support portion for supporting the holding portion, the holding portion is connected through a hinge portion to a case body provided with the support portion, and the holding portion is supported by the support portion in such a manner that the holding portion is folded back to bend the hinge portion.

According to the present temperature measurement device, the holding portion is supported by the support portion in such a manner that the holding portion is folded back to bend the hinge portion with the thermistor element mounting portion being held by the holding portion. Thus, the process of attaching the thermistor element mounting portion can be easily performed.

It is preferable that the flexible printed circuit board has multiple wirings, and the flexible printed circuit board is provided with a wiring for measuring a voltage of the measurement target product in addition to the wiring to be connected to the thermistor element.

It is preferable that wirings are provided on both surfaces of the flexible printed circuit board, a wiring provided on one surface of the flexible printed circuit board is used for measuring the voltage, and a wiring provided on another surface of the flexible printed circuit board is connected to the thermistor element, and a heat collection plate is provided on a back side of a portion of the flexible printed circuit board provided with the thermistor element.

Moreover, it is also preferable that multiple wirings are provided on one surface of the flexible printed circuit board, some of the multiple wirings provided on the one surface are used for measuring the voltage, and the thermistor element is connected to a wiring other than the wirings for measuring the voltage, and a spacer for forming a clearance between the measurement target product and the thermistor element is provided on the flexible printed circuit board to surround the thermistor element.

Furthermore, it is also preferable that multiple wirings are provided on one surface of the flexible printed circuit board, some of the multiple wirings provided on the one surface are used for measuring the voltage, and the thermistor element is connected to a wiring other than the wirings for measuring the voltage, the thermistor element is connected to a wiring provided on a branched portion branched from a flexible printed circuit board body provided with the wirings for measuring the voltage, the thermistor element mounting portion having the thermistor element is held by the holding portion with the branched portion being folded back, and a heat collection plate is provided on a back side of a portion of the branched portion of the flexible printed circuit board provided with the thermistor element.

As described above, according to the present temperature measurement device, the workability upon attachment can be improved.

Hereinafter, an exemplary mode for carrying out the technique of the present disclosure will be described in detail based on embodiments with reference to the drawings. Note that unless otherwise specifically described, the dimensions, materials, shapes, relative arrangement, and the like of components described in these embodiments are not intended to limit the technical scope of the present disclosure only to these dimensions, materials, shapes, relative arrangement, and the like.

In the following embodiments, a case where a voltage monitoring device attached to a battery mounted on, e.g., an electric vehicle also has the function of a temperature measurement device will be described as an example. Note that the temperature measurement devices according to the present embodiments are applicable for the purposes of measuring the temperatures of various measurement target products.

First Embodiment

Figure 1B:
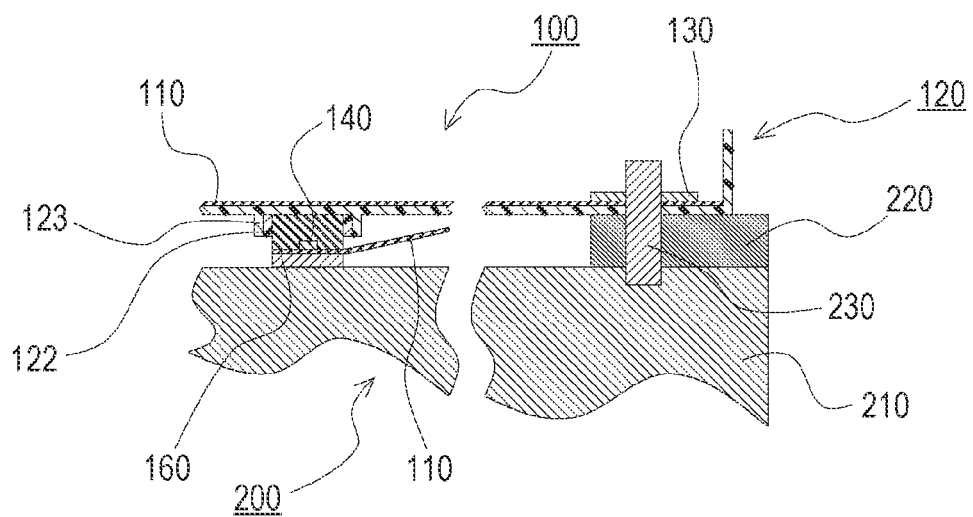
Figure 2A:
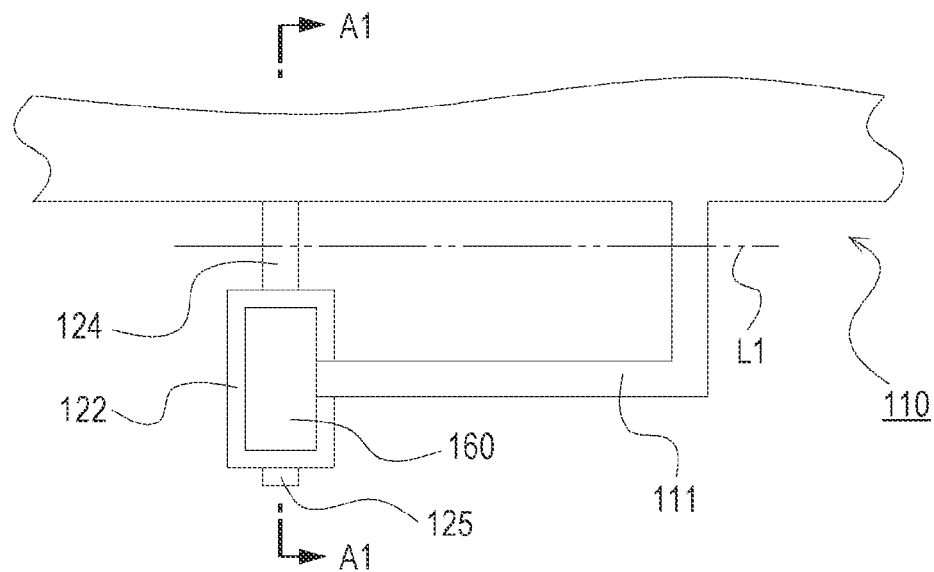
FIGS. 2A and 2B are schematic configuration views of the temperature measurement device according to the first embodiment of the present disclosure.
Figure 2B:
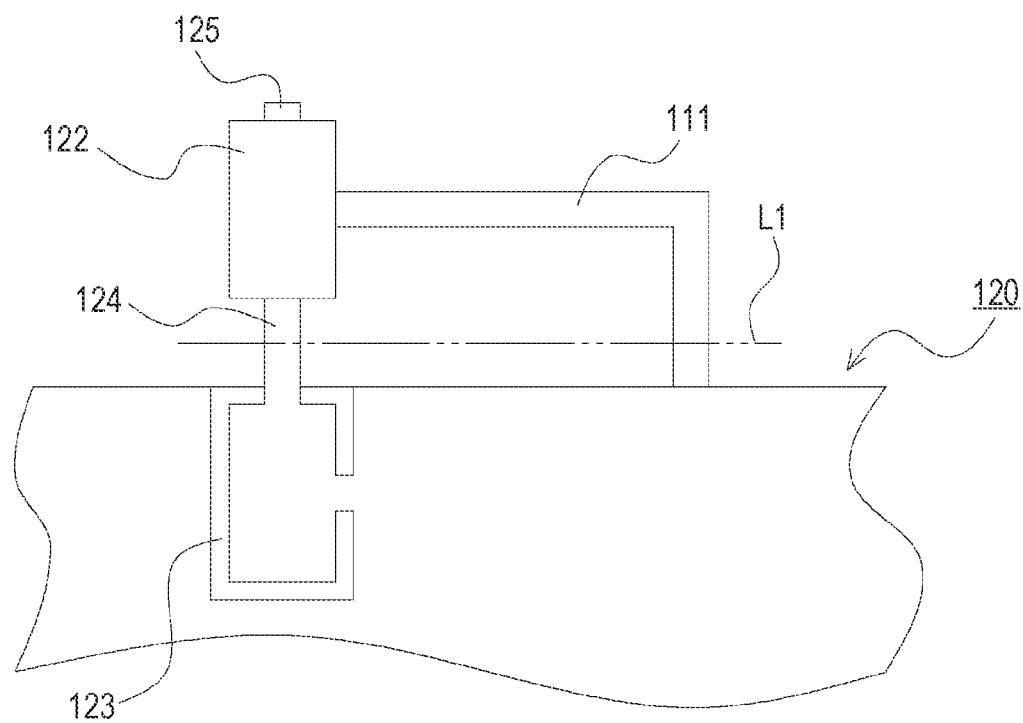
Figure 3A:
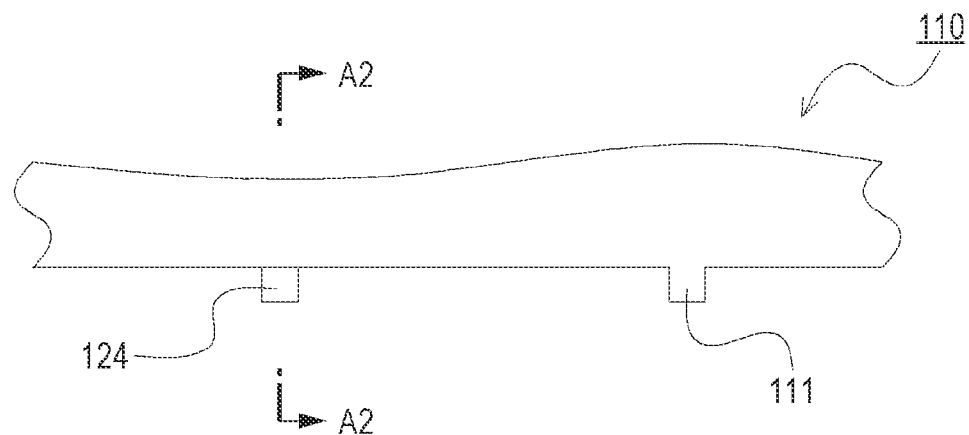
FIGS. 3A and 3B are schematic configuration views of the temperature measurement device according to the first embodiment of the present disclosure.
Figure 3B:
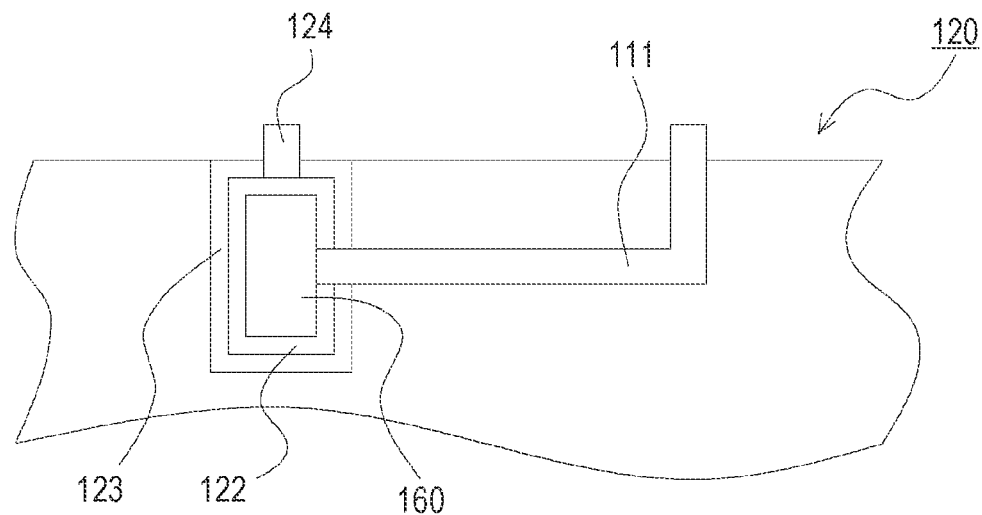
Figure 4A:
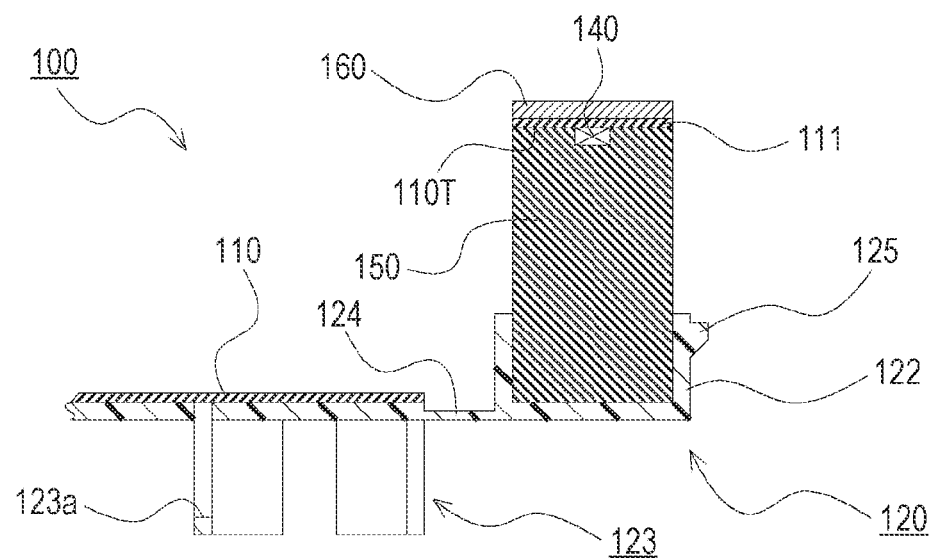
FIGS. 4A and 4B are schematic sectional views of the temperature measurement device according to the first embodiment of the present disclosure.
Figure 4B:
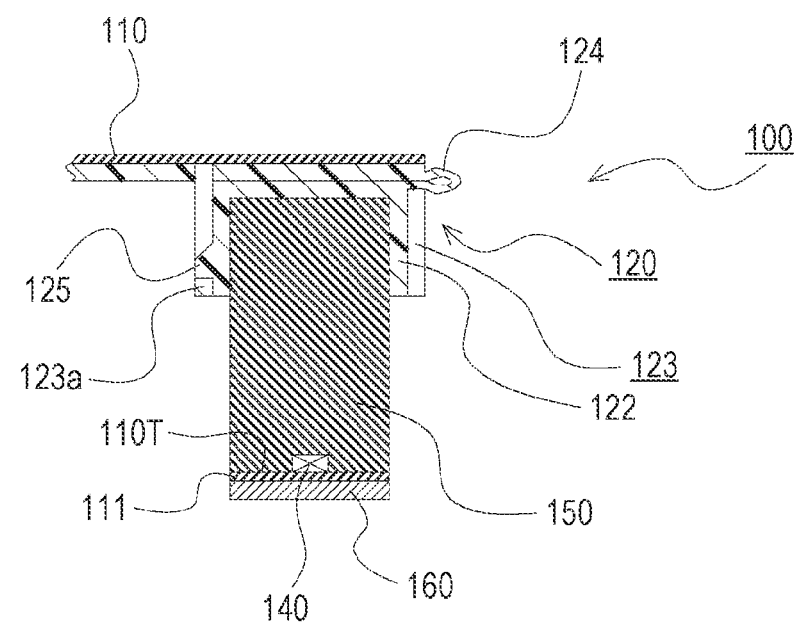

A temperature measurement device according to a first embodiment of the present disclosure will be described with reference to FIGS. 1A to 4B. FIGS. 1A and 1B are views for describing the process of attaching the temperature measurement device according to the first embodiment of the present disclosure to a battery. FIG. 1A is a schematic sectional view showing a state in the middle of attachment. FIG. 1B is a schematic sectional view showing a state after attachment. FIGS. 2A and 2B are schematic configuration views of the temperature measurement device according to the first embodiment of the present disclosure. FIG. 2A is part of a plan view showing a state before a holding portion is supported by a support portion. FIG. 2B is part of a back view showing the state before the holding portion is supported by the support portion. FIGS. 3A and 3B are schematic configuration views of the temperature measurement device according to the first embodiment of the present disclosure. FIG. 3A is part of a plan view showing a state in which the holding portion is supported by the support portion. FIG. 3B is part of a back view showing the state in which the holding portion is supported by the support portion. FIGS. 4A and 4B are schematic sectional views of the temperature measurement device according to the first embodiment of the present disclosure. FIG. 4A corresponds to a section along an A1-A1 line in FIG. 2A. FIG. 4B corresponds to a section along an A2-A2 line in FIG. 3A.

<Outline of Battery and Voltage Monitoring Device>

In advance of detailed description of the temperature measurement device according to the present embodiment, the outline of the battery and a voltage monitoring device also having the function of the temperature measurement device will be described with reference to FIGS. 1A and 1B.

The battery 200 includes multiple cells 210. FIGS. 1A and 1B show only one cell 210. A base 220 for a case 120 and electrodes 230 are provided at an upper portion of the cell 210. Since a well-known technique is employed for the battery, detailed description thereof will be omitted. The electrodes 230 (one is a positive electrode, and the other one is a negative electrode) are each provided at both ends of the upper portion of the cell 210. The multiple cells 210 are arrayed such that the positive and negative electrodes are adjacent to each other. Moreover, the multiple cells 210 are connected in series in such a manner that adjacent ones of the positive and negative electrodes are electrically connected to each other through a bus bar 130 provided at the temperature measurement device (the voltage monitoring device) 100.

The temperature measurement device 100 includes the resin case 120 fixed to a measurement target product (the battery 200 in the present embodiment), a flexible printed circuit board (hereinafter referred to as an FPC) 110 attached to the case 120, and the above-described bus bar 130. Further, the temperature measurement device 100 includes a thermistor element mounting portion. The thermistor element mounting portion according to the present embodiment includes a thermistor element 140 to be electrically connected to a wiring provided on the FPC 110, an elastic body 150, and a heat collection plate 160. A connector (not shown) is attached to a tip end of the FPC 110. This connector is connected to a device (not shown) configured to measure the voltage and temperature of the cell 210 forming the battery 200 to perform various types of control.

The case 120, the FPC 110, and the bus bar 130 are respectively provided with through-holes 121, 110a, 130a. The temperature measurement device 100 is attached to the battery 200 such that the electrodes 230 are inserted into these through-holes 121, 110a, 130a. Accordingly, the heat collection plate 160 of the thermistor element mounting portion contacts an upper surface of the cell 210. Note that for the battery 200, the voltages of all of the cells 210 are monitored, but the temperatures of all of the cells 210 are not necessarily monitored. Thus, the number of thermistor element mounting portions to be provided is according to the number of cells 210 provided at the battery 200 and use environment.

<Temperature Measurement Device>

The temperature measurement device 100 will be described in more detail. As described above, the temperature measurement device 100 includes the case 120, the FPC 110, and the thermistor element mounting portion. Since a well-known technique is employed for the structure of the FPC 110, detailed description thereof will be omitted. The FPC 110 generally includes a base film, multiple wirings provided on the base film and formed by etching of copper foil, a cover film covering the multiple wirings, and the like. The wirings are provided on each surface of the FPC 110 according to the present embodiment. That is, the wirings are formed on both surfaces of the FPC 110 from a material generally called a double-sided copper-clad laminate in such a manner that metal foil (copper foil) on both surfaces of the base film is etched.

The multiple wirings provided on one surface 110S of the FPC 110 are used for measuring the voltage, and the thermistor element 140 is connected at least to one wiring provided on the other surface 110T. More specifically, the FPC 110 according to the present embodiment is provided with a branched portion 111 branched from a flexible printed circuit board body (an FPC body) with the multiple wirings for measuring the voltage. The wiring to be connected to the thermistor element 140 is arranged on the branched portion 111. The multiple wirings provided on one surface 110S of the FPC body of the FPC 110 are each electrically connected to the electrodes 230 of the cells 210 in such a manner that end portions of these wirings exposed through the cover film electrically contact the bus bar 130. Of the wiring provided on the other surface 110T of the branched portion 111, an end portion exposed through the cover film is electrically connected to the thermistor element 140.

The elastic body 150 is attached to a portion of the branched portion 111 provided with the thermistor element 140 to cover the thermistor element 140. The elastic body 150 may be made of, for example, a rubber foam-based or urethane foam-based material. The elastic body 150 may be attached to the branched portion 111 with, e.g., a double-sided tape. Moreover, the heat collection plate 160 is provided on the back side (a side closer to one surface 110S) of the portion of the branched portion 111 provided with the thermistor element 140. The heat collection plate 160 is formed of, e.g., an aluminum plate member. Moreover, the heat collection plate 160 may be bonded to the branched portion 111 of the FPC 110 with, e.g., a double-sided tape.

The case 120 has a holding portion 122 holding the thermistor element mounting portion and a support portion 123 supporting the holding portion 122. The case 120 is configured such that the support portion 123 is provided at a case body to be attached to the FPC body of the FPC 110. The case body and the holding portion 122 are connected to each other through a hinge portion 124 (see FIGS. 2A and 2B). The case 120 is a resin molded product, and the case body having the support portion 123, the hinge portion 124, and the holding portion 122 are integrally provided. The above-described thermistor element mounting portion including the thermistor element 140, the elastic body 150, and the heat collection plate 160 is held by the holding portion 122. An end portion of the elastic body 150 opposite to the heat collection plate 160 is fitted in the holding portion 122 so that the thermistor element mounting portion can be held by the holding portion 122. In this state, the elastic body 150 may be bonded to the holding portion 122 with, e.g., a double-sided tape.

In the temperature measurement device 100 configured as described above, the holding portion 122 is supported by the support portion 123 in such a manner that the holding portion 122 is folded back at a fold line indicated by a chain line L1 shown in FIGS. 2A and 2B to bend the hinge portion 124 and the branched portion 111 (see FIGS. 3A, 3B, and 4B). Note that the holding portion 122 is folded back to the far side as viewed in the plane of paper of FIG. 2A. On the other hand, the holding portion 122 is folded back to the near side as viewed in the plane of paper of FIG. 2B.

In the present embodiment, an engagement projection 125 is provided at the holding portion 122, and an engagement target portion 123a is provided at the support portion 123. With this configuration, a state in which the engagement projection 125 engages with the engagement target portion 123a is brought when the holding portion 122 is folded back. Thus, the holding portion 122 is more reliably supported by the support portion 123. Note that the hinge portion 124 may be cut and removed after the holding portion 122 has been supported by the support portion 123.

As described above, the temperature measurement device 100 is attached to the battery 200 with the holding portion 122 being supported by the support portion 123, as shown in FIGS. 1A and 1B. When the temperature measurement device 100 is attached to the battery 200, the elastic body 150 is brought into a state in which the elastic body 150 is elastically compressed. Thus, the heat collection plate 160 can properly contact the upper surface of the cell 210 even with, for example, dimension errors of various members.

<Advantages of Temperature Measurement Device According to Present Embodiment>

According to the temperature measurement device 100 of the present embodiment, the holding portion 122 is supported by the support portion 123 in such a manner that the holding portion 122 is folded back to bend the hinge portion 124 in a state in which the thermistor element mounting portion is held by the holding portion 122. Thus, the process of attaching the thermistor element mounting portion can be easily performed.

Moreover, in the present embodiment, heat of a temperature measurement portion of the measurement target product is transmitted to the thermistor element 140 through the FPC 110 (the branched portion 111) from the heat collection plate 160 provided opposite to the thermistor element 140. Thus, the accuracy of temperature measurement can be enhanced.

Second Embodiment

Figure 5A:
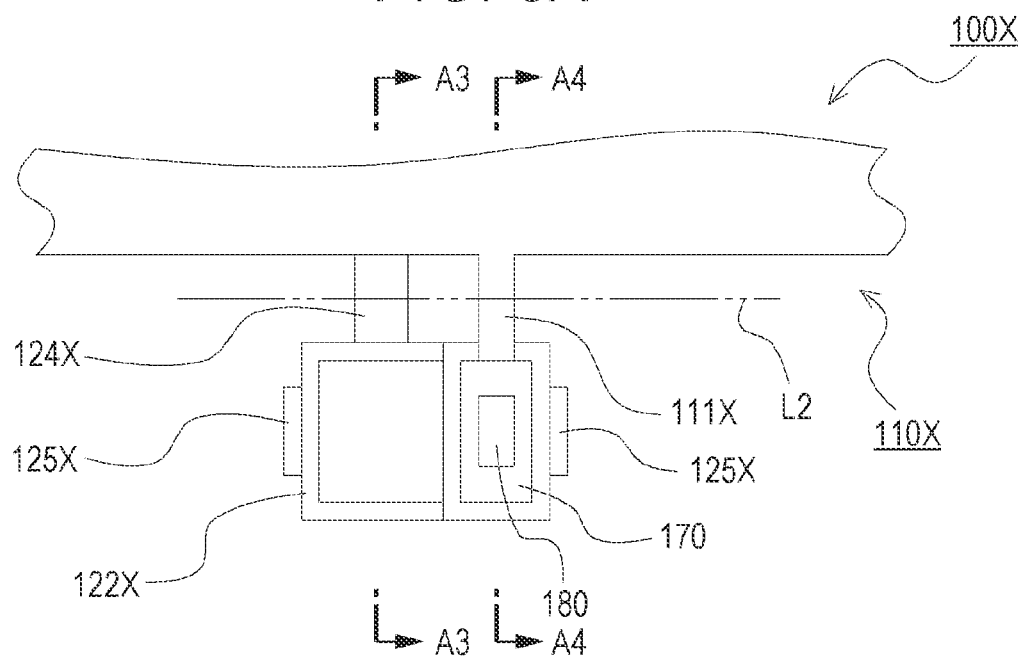
FIGS. 5A and 5B are schematic configuration views of a temperature measurement device according to a second embodiment of the present disclosure.
Figure 5B:
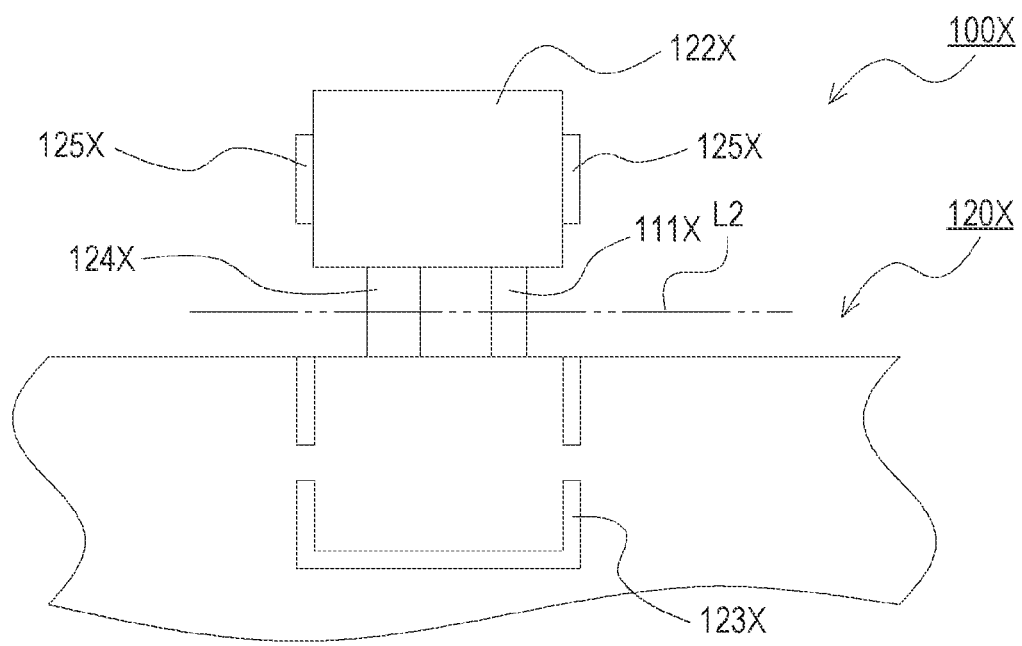
Figure 6A:
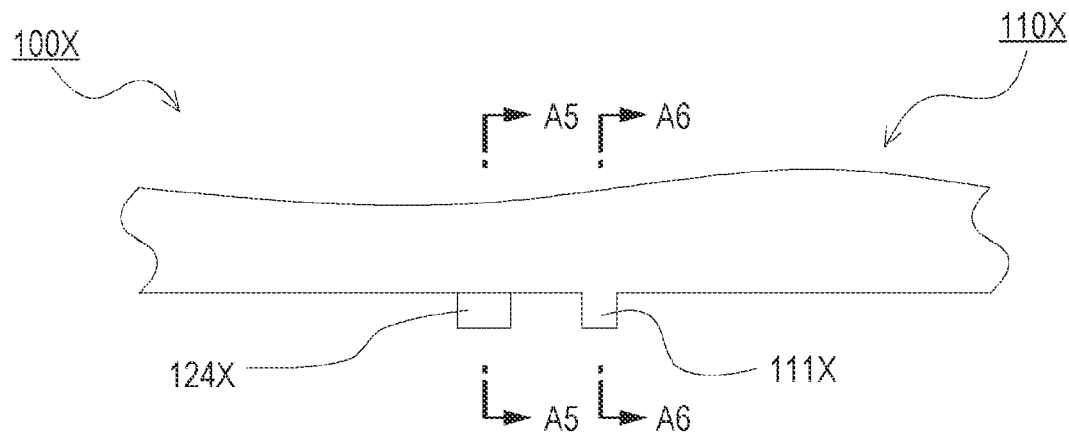
FIGS. 6A and 6B are schematic configuration views of the temperature measurement device according to the second embodiment of the present disclosure.
Figure 6B:
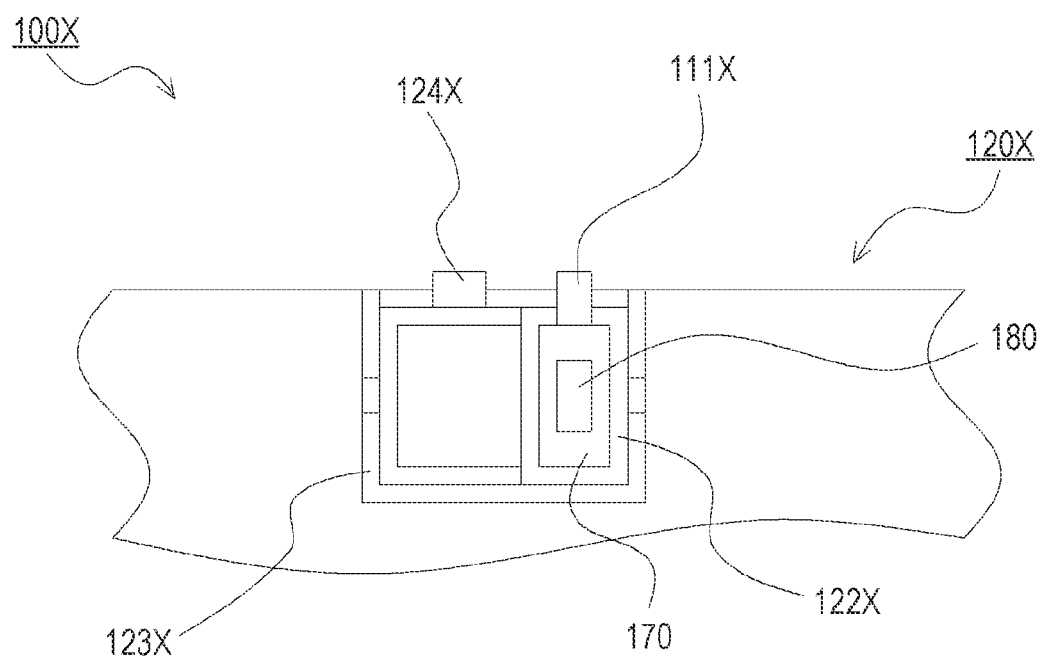
Figure 7A:
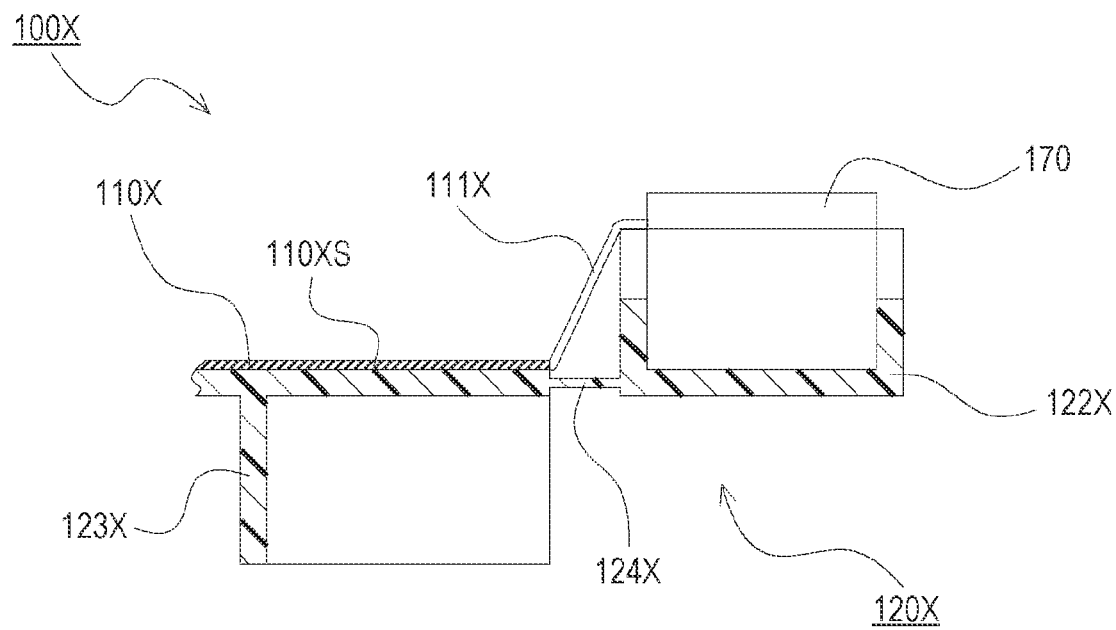
FIGS. 7A and 7B are schematic sectional views of the temperature measurement device according to the second embodiment of the present disclosure.
Figure 7B:
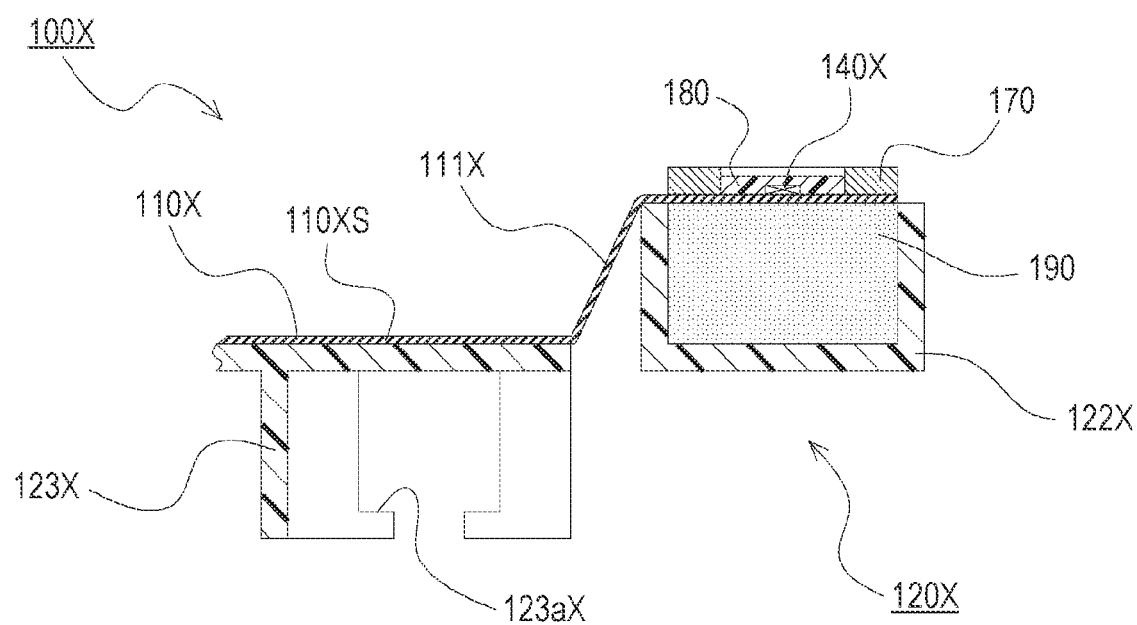
Figure 8A:
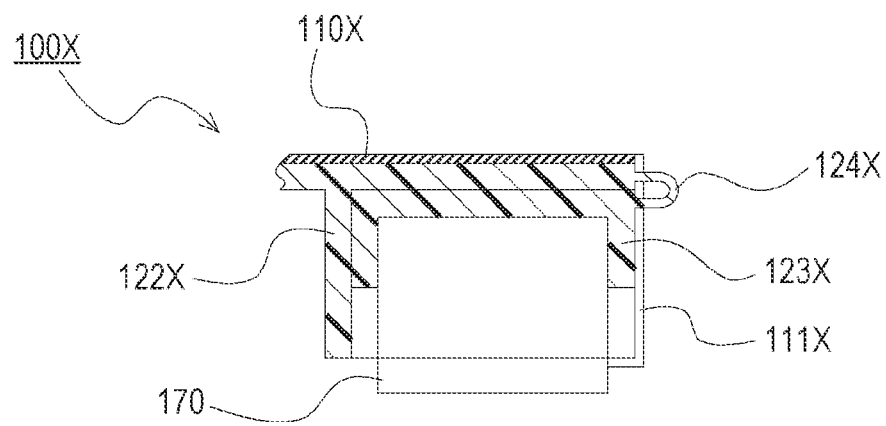
FIGS. 8A and 8B are schematic sectional views of the temperature measurement device according to the second embodiment of the present disclosure.
Figure 8B:
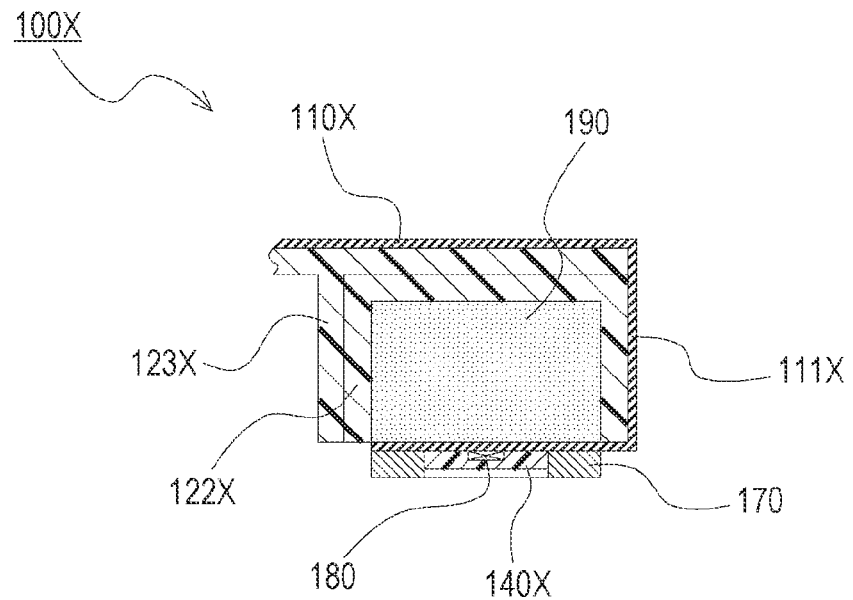

A temperature measurement device according to a second embodiment of the present disclosure will be described with reference to FIGS. 5A to 8B. FIGS. 5A and 5B are schematic configuration views of the temperature measurement device according to the second embodiment of the present disclosure. FIG. 5A is part of a plan view showing a state before a holding portion is supported by a support portion. FIG. 5B is part of a back view showing the state before the holding portion is supported by the support portion. FIGS. 6A and 6B are schematic configuration views of the temperature measurement device according to the second embodiment of the present disclosure. FIG. 6A is part of a plan view showing a state in which the holding portion is supported by the support portion. FIG. 6B is part of a back view showing the state in which the holding portion is supported by the support portion. FIGS. 7A and 7B are schematic sectional views of the temperature measurement device according to the second embodiment of the present disclosure. FIG. 7A corresponds to a section along an A3-A3 line in FIG. 5A. FIG. 7B corresponds to a section along an A4-A4 line in FIG. 5A. FIGS. 8A and 8B are schematic sectional views of the temperature measurement device according to the second embodiment of the present disclosure. FIG. 8A corresponds to a section along an A5-A5 line in FIG. 6A. FIG. 8B corresponds to a section along an A6-A6 line in FIG. 6A.

The outline of a battery and a voltage monitoring device also having the function of the temperature measurement device is as described in the first embodiment, and therefore, description thereof will be omitted.

The temperature measurement device 100X according to the present embodiment also includes a resin case 120X fixed to a measurement target product (the battery 200 in the present embodiment), an FPC 110X attached to the case 120X, and a bus bar. Note that the configurations of the bus bar and a location to which the bus bar is attached are similar to those of the first embodiment above.

Further, the temperature measurement device 100X includes a thermistor element mounting portion. The thermistor element mounting portion according to the present embodiment includes a thermistor element 140X to be electrically connected to a wiring provided on the FPC 110X, a spacer 170, a sealing portion 180, and a filling portion 190. A connector (not shown) attached to a tip end of the FPC 110X is as described in the first embodiment. Attachment of the temperature measurement device 100X to the battery is also as described in the first embodiment.

<Temperature Measurement Device>

The temperature measurement device 100X will be described in more detail. As described above, the temperature measurement device 100X includes the case 120X, the FPC 110X, and the thermistor element mounting portion. A basic structure of the FPC 110X is as described in the first embodiment. Multiple wirings are provided on one surface of the FPC 110X according to the present embodiment. That is, the multiple wirings are formed on one surface of the FPC 110X from a material generally called single-sided copper-clad laminate in such a manner that metal foil (copper foil) provided on one surface of a base film is etched.

Some of the multiple wirings provided on one surface of the FPC 110X are used for measuring a voltage, and the thermistor element 140X is connected to the wiring other than the wirings for measuring the voltage. More specifically, the FPC 110X according to the present embodiment is provided with a branched portion 111X branched from an FPC body with the multiple wirings for measuring the voltage. The wiring to be connected to the thermistor element 140X is arranged on the branched portion 111X. The multiple wirings provided on one surface 110XS of the FPC body of the FPC 110X are each electrically connected to electrodes of cells in such a manner that end portions of these wirings exposed through the cover film electrically contact the bus bar. Of the wiring provided on one surface 110XS of the branched portion 111X, an end portion exposed through the cover film is electrically connected to the thermistor element 140X.

The spacer 170 is attached to a portion of the branched portion 111X, provided with the thermistor element 140X, to surround the thermistor element 140X. The spacer 170 may be made of a material such as aluminum. The spacer 170 is provided to form a clearance between the measurement target product and the thermistor element 140X. Moreover, the thermistor element 140X is embedded in the sealing portion 180. For example, the sealing portion 180 may be provided in such a manner that a potting material such as epoxy is applied into the spacer 170 after the thermistor element 140X has been attached to the FPC 110X and the spacer 170 has been also attached to the FPC 110X with, e.g., a double-sided tape. The filling portion 190 is provided opposite to the thermistor element 140X through the FPC 110X. The filling portion 190 is bonded to the FPC 110X with, e.g., a double-sided tape.

The case 120X has a holding portion 122X holding the thermistor element mounting portion and a support portion 123X supporting the holding portion 122X. The case 120X is configured such that the support portion 123X is provided at a case body to be attached to the FPC body of the FPC 110X. The case body and the holding portion 122X are connected to each other through a hinge portion 124X. The case 120X is a resin molded product, and the case body having the support portion 123X, the hinge portion 124X, and the holding portion 122X are integrally provided.

The above-described thermistor element mounting portion including the thermistor element 140X, the spacer 170, the sealing portion 180, and the filling portion 190 is held by the holding portion 122X. The thermistor element mounting portion is held by the holding portion 122X such that the inside of a box shape of the holding portion 122X holding the thermistor element mounting portion is filled with the filling portion 190. In this state, the filling portion 190 may be bonded to the holding portion 122X with, e.g., a double-sided tape.

In the temperature measurement device 100X configured as described above, the holding portion 122X is supported by the support portion 123X in such a manner that the holding portion 122X is folded back at a fold line indicated by a chain line L2 shown in FIGS. 5A and 5B to bend the hinge portion 124X and the branched portion 111X (see FIGS. 6A, 6B, 8A, and 8B). Note that the holding portion 122X is folded back to the far side as viewed in the plane of paper of FIG. 5A. On the other hand, the holding portion 122X is folded back to the near side as viewed in the plane of paper of FIG. 5B.

In the present embodiment, an engagement projection 125X is provided at the holding portion 122X, and an engagement target portion 123aX is provided at the support portion 123X. With this configuration, a state in which the engagement projection 125X engages with the engagement target portion 123aX is brought when the holding portion 122X is folded back. Thus, the holding portion 122X is more reliably supported by the support portion 123X. Note that the hinge portion 124X may be cut and removed after the holding portion 122X has been supported by the support portion 123X.

As described above, the temperature measurement device 100X is, as in the first embodiment, attached to the battery 200 with the holding portion 122X being supported by the support portion 123X. In the present embodiment, when the temperature measurement device 100X is attached to the battery 200, a state in which the spacer 170 contacts an upper surface of the cell 210 is brought, and a state in which a space (an air space) is provided between the thermistor element 140X and the cell 210 is brought.

<Advantages of Temperature Measurement Device According to Present Embodiment>

Also, according to the temperature measurement device 100X of the present embodiment, as in the first embodiment, the holding portion 122X is supported by the support portion 123X in such a manner that the holding portion 122X is folded back to bend the hinge portion 124X in a state in which the thermistor element mounting portion is held by the holding portion 122X. Thus, the process of attaching the thermistor element mounting portion can be easily performed.

Moreover, in the present embodiment, heat of a temperature measurement portion of the measurement target product is transmitted to the thermistor element 140X through, e.g., the air space. Thus, there is a probability that the accuracy of temperature measurement is lower than that of the first embodiment. However, in the present embodiment, it may only be required that the wirings are provided only on one surface of the FPC 110X. That is, the single-sided copper-clad laminate can be used as the material of the FPC 110X. Thus, a cost can be reduced as compared to the case of using a double-sided copper-clad laminate.

Third Embodiment

Figure 9A:
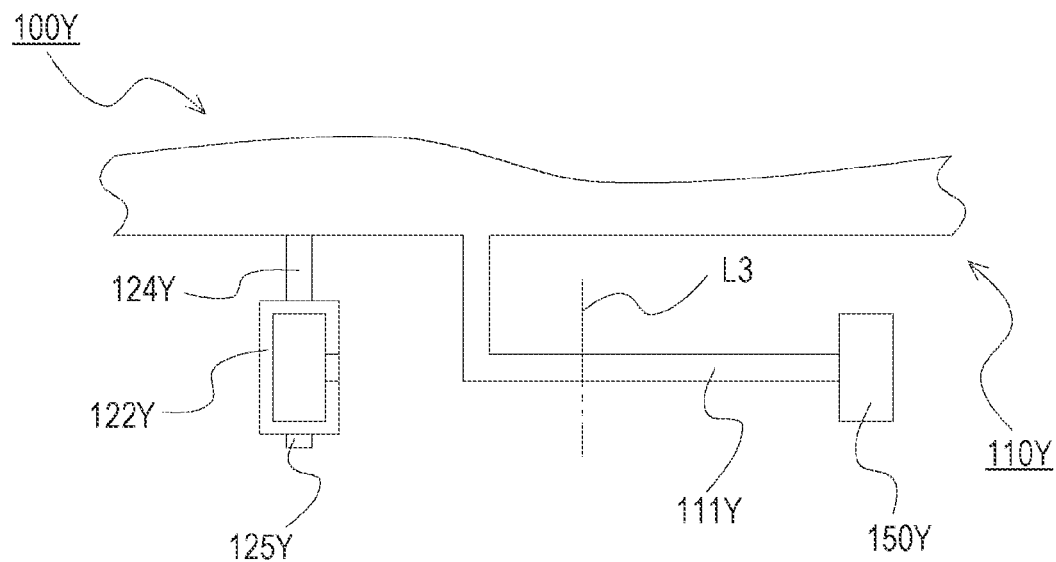
FIGS. 9A and 9B are schematic configuration views of a temperature measurement device according to a third embodiment of the present disclosure.
Figure 9B:
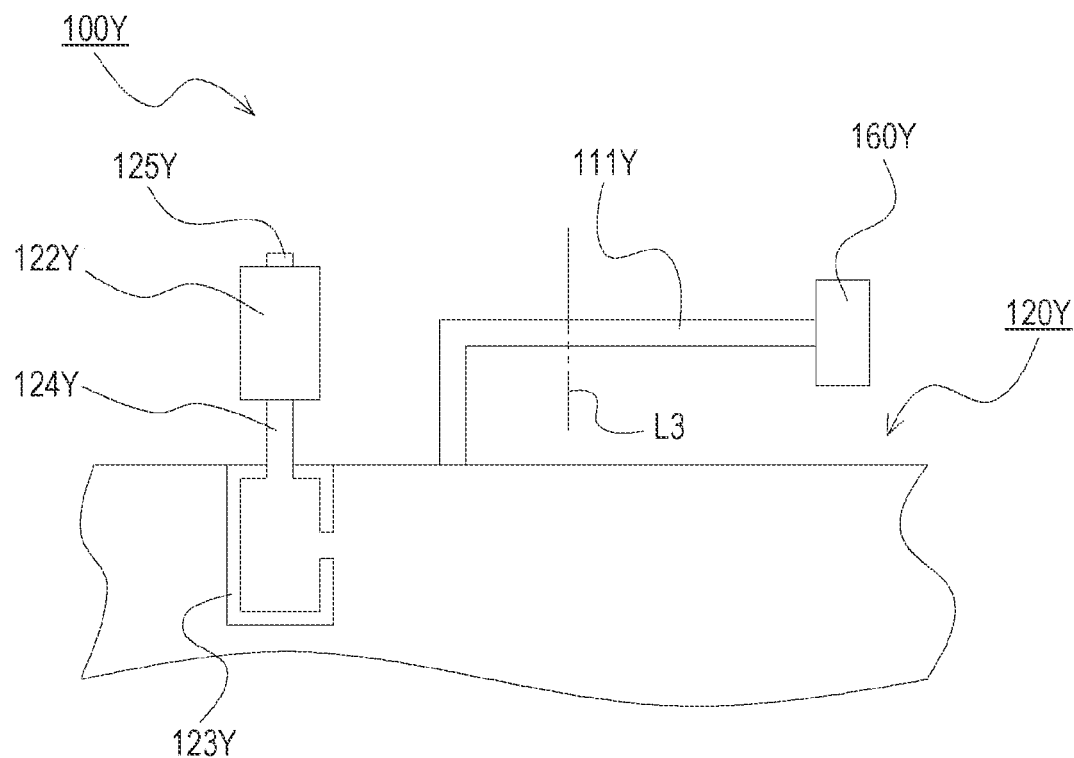
Figure 10A:
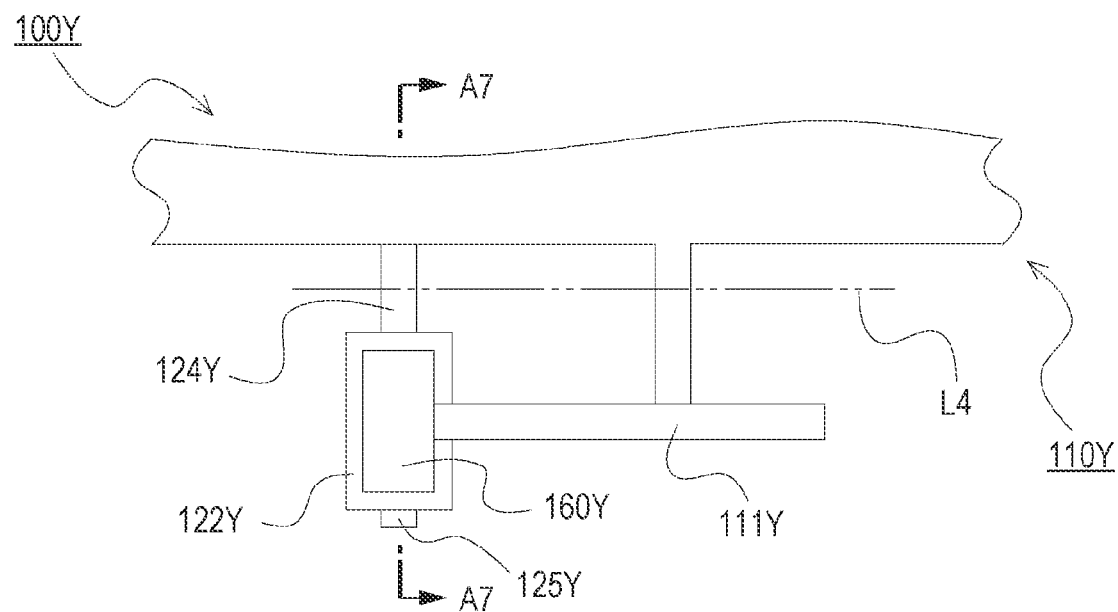
FIGS. 10A and 10B are schematic configuration views of the temperature measurement device according to the third embodiment of the present disclosure.
Figure 10B:
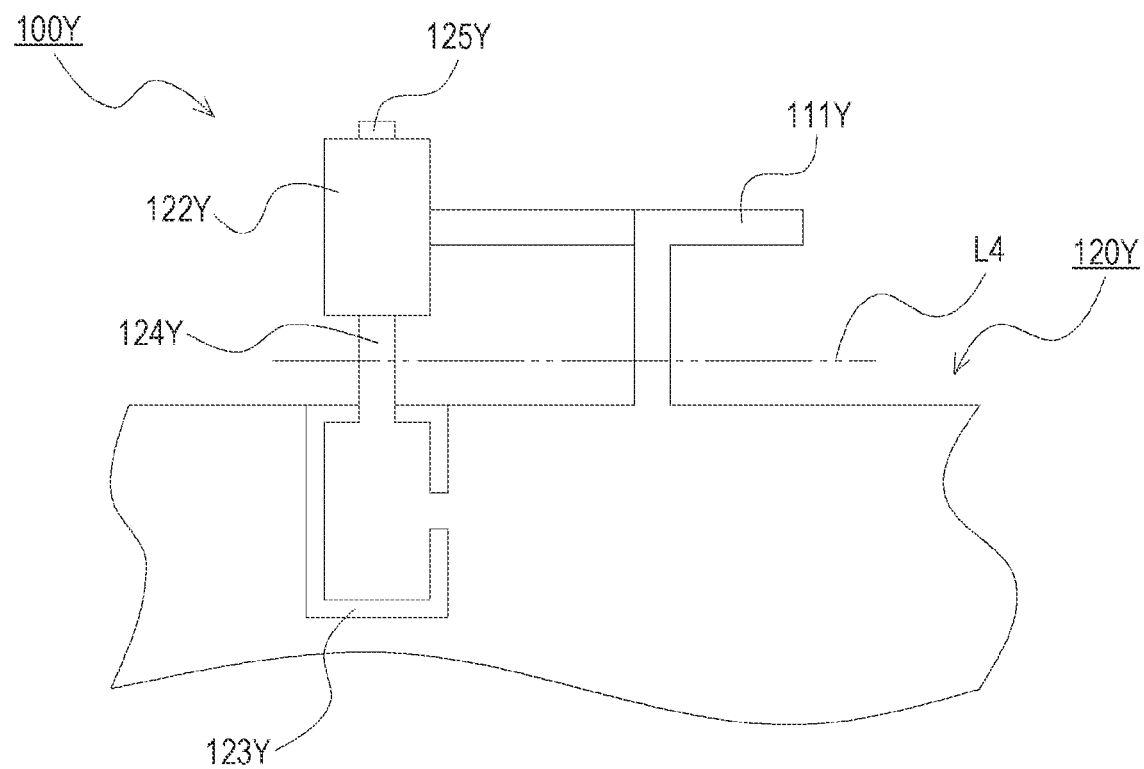
Figure 11A:
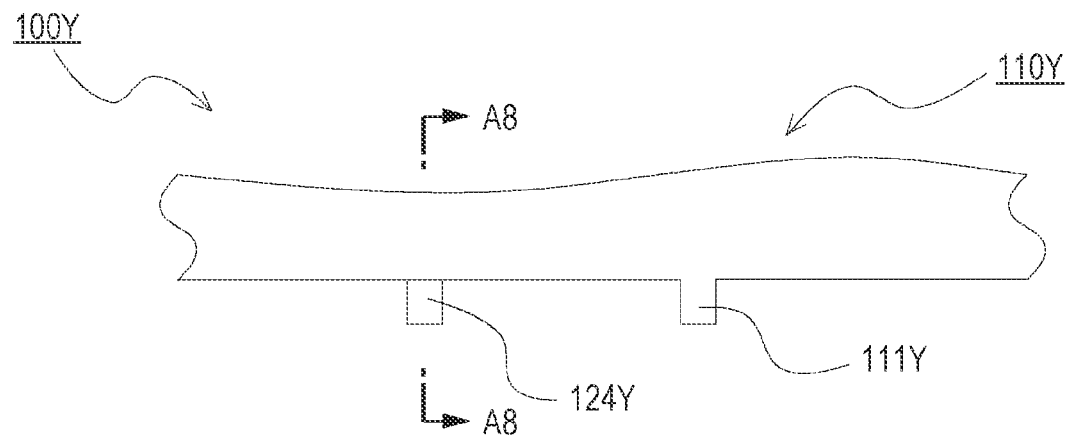
FIGS. 11A and 11B are schematic configuration views of the temperature measurement device according to the third embodiment of the present disclosure.
Figure 11B:
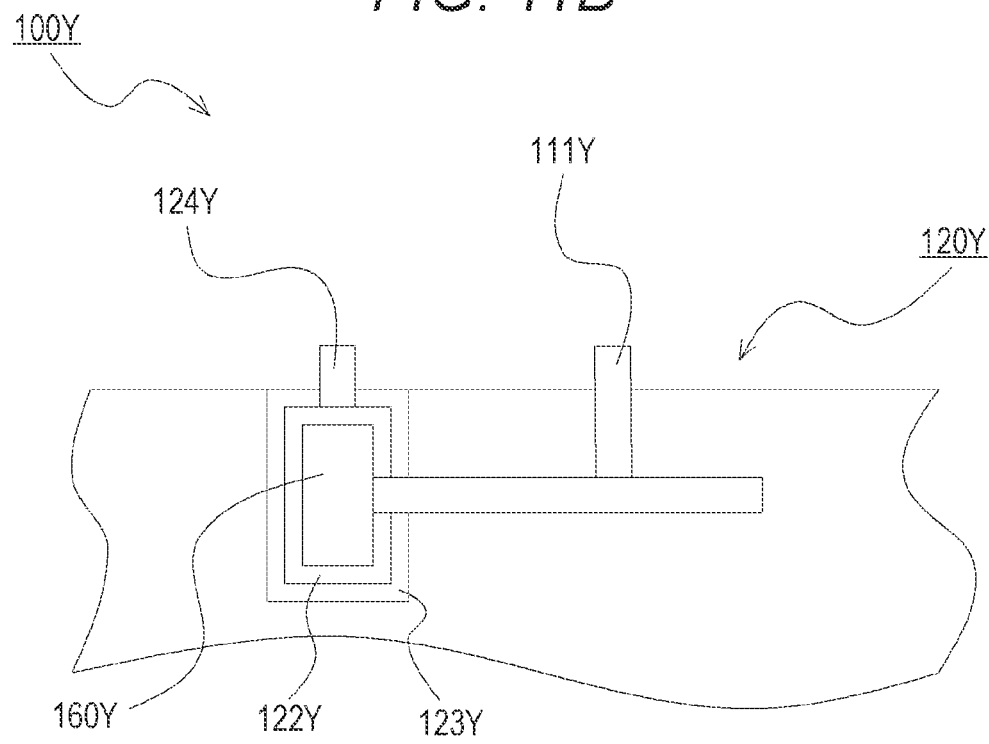
Figure 12A:
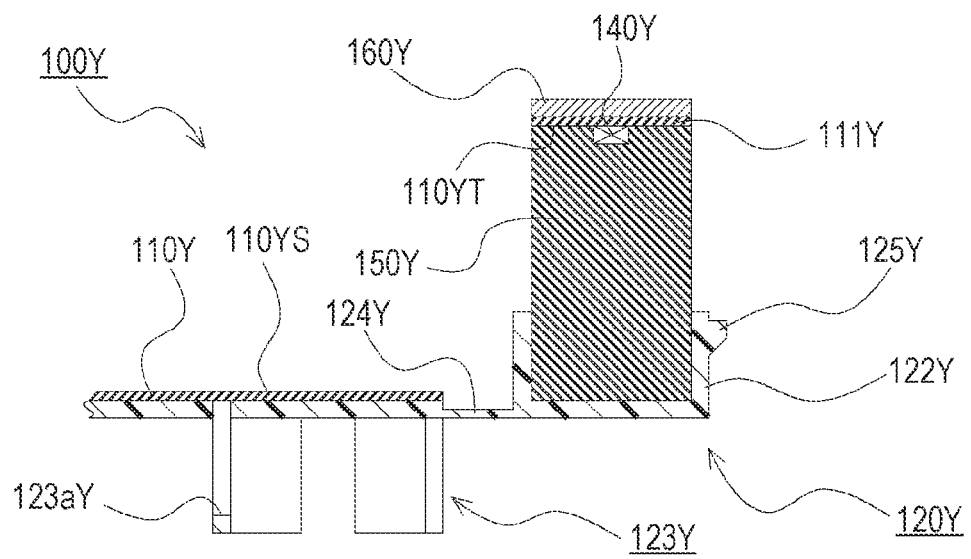
FIGS. 12A and 12B are schematic sectional views of the temperature measurement device according to the third embodiment of the present disclosure.
Figure 12B:
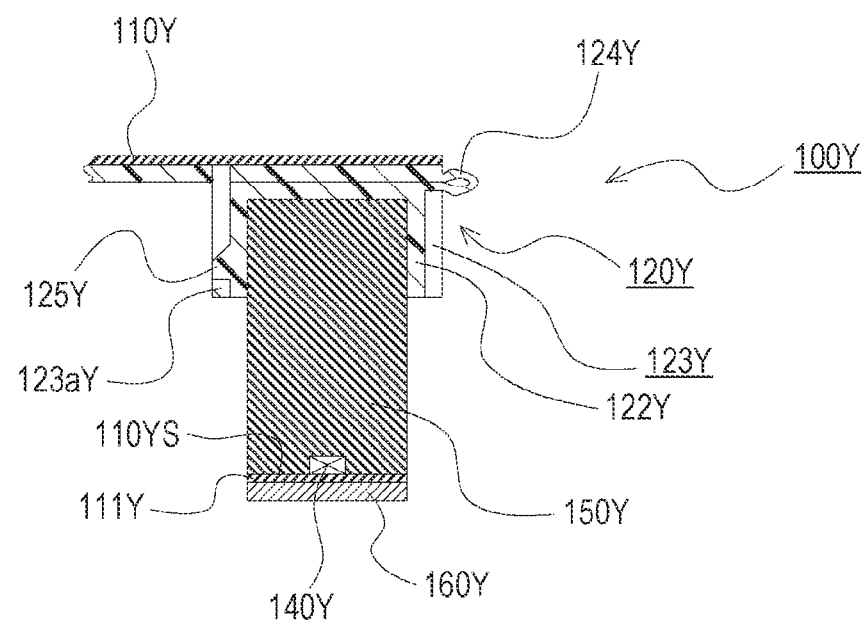

A temperature measurement device according to a third embodiment of the present disclosure will be described with reference to FIGS. 9A to 12B. FIGS. 9A and 9B are schematic configuration views of the temperature measurement device according to the third embodiment of the present disclosure. FIG. 9A is part of a plan view showing a state before a thermistor element mounting portion is held by a holding portion. FIG. 9B is part of a back view showing the state before the thermistor element mounting portion is held by the holding portion. FIGS. 10A and 10B are schematic configuration views of the temperature measurement device according to the third embodiment of the present disclosure. FIG. 10A is part of a plan view showing a state before the thermistor element mounting portion is held by the holding portion and the holding portion is supported by a support portion. FIG. 10B is part of a back view showing the state before the thermistor element mounting portion is held by the holding portion and the holding portion is supported by the support portion. FIGS. 11A and 11B are schematic configuration views of the temperature measurement device according to the third embodiment of the present disclosure. FIG. 11A is part of a plan view showing a state in which the holding portion is supported by the support portion. FIG. 11B is part of a back view showing the state in which the holding portion is supported by the support portion. FIGS. 12A and 12B are schematic sectional views of the temperature measurement device according to the third embodiment of the present disclosure. FIG. 12A corresponds to a section along an A7-A7 line in FIG. 10A. FIG. 12B corresponds to a section along an A8-A8 line in FIG. 11A.

The outline of a battery and a voltage monitoring device also having the function of the temperature measurement device is as described in the first embodiment, and therefore, description thereof will be omitted.

The temperature measurement device 100Y according to the present embodiment also includes a resin case 120Y fixed to a measurement target product (the battery 200 in the present embodiment), an FPC 110Y attached to the case 120Y, and a bus bar. Note that the configurations of the bus bar and a location to which the bus bar is attached are similar to those of the first embodiment above.

Further, the temperature measurement device 100Y includes the thermistor element mounting portion. The configuration of the thermistor element mounting portion according to the present embodiment is similar to that of the first embodiment, and therefore, description thereof will be omitted. A connector (not shown) attached to a tip end of the FPC 110Y is as described in the first embodiment. Attachment of the temperature measurement device 100Y to the battery is also as described in the first embodiment.

<Temperature Measurement Device>

The temperature measurement device 100Y will be described in more detail. As described above, the temperature measurement device 100Y includes the case 120Y, the FPC 110Y, and the thermistor element mounting portion. A basic structure of the FPC 110Y is as described in the first embodiment. Multiple wirings are provided on one surface of the FPC 110Y according to the present embodiment. That is, the multiple wirings are formed on one surface of the FPC 110Y from a material generally called single-sided copper-clad laminate in such a manner that metal foil (copper foil) provided on one surface of a base film is etched.

Some of the multiple wirings provided on one surface of the FPC 110Y are used for measuring a voltage, and the thermistor element 140Y is connected to the wiring other than the wirings for measuring the voltage. More specifically, the FPC 110Y according to the present embodiment is provided with a branched portion 111Y branched from an FPC body with the multiple wirings for measuring the voltage. The wiring to be connected to the thermistor element 140Y is arranged on the branched portion 111Y. The multiple wirings provided on one surface 110YS of the FPC body of the FPC 110Y are each electrically connected to electrodes of cells in such a manner that end portions of these wirings exposed through the cover film electrically contact the bus bar. Of the wiring provided on one surface 110YS of the branched portion 111Y, an end portion exposed through the cover film is electrically connected to the thermistor element 140Y.

An elastic body 150Y is attached to a portion of the branched portion 111Y, provided with the thermistor element 140Y, to cover the thermistor element 140Y. The elastic body 150Y is as described in the first embodiment. Moreover, a heat collection plate 160Y is provided on the back side (a side closer to the other surface 11 OYT) of the portion of the branched portion 111Y provided with the thermistor element 140Y. The heat collection plate 160Y is as described in the first embodiment.

The case 120Y has a holding portion 122Y holding the thermistor element mounting portion and a support portion 123Y supporting the holding portion 122Y. The case 120Y is configured such that the support portion 123Y is provided at a case body to be attached to the FPC body of the FPC 110Y. The case body and the holding portion 122Y are connected to each other through a hinge portion 124Y. The case 120Y is a resin molded product, and the case body having the support portion 123Y, the hinge portion 124Y, and the holding portion 122Y are integrally provided.

In the temperature measurement device 100Y configured as described above, the thermistor element mounting portion is held by the holding portion 122Y in such a manner that the thermistor element mounting portion (the thermistor element 140Y, the elastic body 150Y, and the heat collection plate 160Y) is folded back at a fold line indicated by a chain line L3 shown in FIGS. 9A and 9B to bend the branched portion 111Y. Note that the thermistor element mounting portion is folded back to the near side as viewed in the plane of paper of FIG. 9A. On the other hand, the thermistor element mounting portion is folded back to the far side as viewed in the plane of paper of FIG. 9B. With this configuration, an end portion of the elastic body 150Y opposite to the heat collection plate 160Y is fitted in the holding portion 122Y so that the thermistor element mounting portion can be held by the holding portion 122Y. In this state, the elastic body 150Y may be bonded to the holding portion 122Y with, e.g., a double-sided tape.

Next, the holding portion 122Y is supported by the support portion 123Y in such a manner that the holding portion 122Y is folded back at a fold line indicated by a chain line L4 shown in FIGS. 10A and 10B to bend the hinge portion 124Y and the branched portion 111Y (see FIGS.

11A, 11B, and 12B). Note that the holding portion 122Y is folded back to the far side as viewed in the plane of paper of FIG. 10A. On the other hand, the holding portion 122Y is folded back to the near side as viewed in the plane of paper of FIG. 10B.

In the present embodiment, an engagement projection 125Y is provided at the holding portion 122Y, and an engagement target portion 123aY is provided at the support portion 123Y. With this configuration, a state in which the engagement projection 125Y engages with the engagement target portion 123aY is brought when the holding portion 122Y is folded back. Thus, the holding portion 122Y is more reliably supported by the support portion 123Y. Note that the hinge portion 124Y may be cut and removed after the holding portion 122Y has been supported by the support portion 123Y.

As described above, the temperature measurement device 100Y is, as in the first embodiment, attached to the battery 200 with the holding portion 122Y being supported by the support portion 123Y. When the temperature measurement device 100Y is attached to the battery 200, a state in which the elastic body 150Y is elastically compressed is brought. Thus, the heat collection plate 160Y can properly contact an upper surface of a cell 210 even with, for example, dimension errors of various members.

<Advantages of Temperature Measurement Device According to Present Embodiment>

According to the temperature measurement device 100Y of the present embodiment, the holding portion 122Y is, as in the first embodiment, supported by the support portion 123Y in such a manner that the holding portion 122Y is folded back to bend the hinge portion 124Y with the thermistor element mounting portion being held by the holding portion 122Y. In the case of the present embodiment, a fold-back process is increased by one step as compared to the first embodiment because the thermistor element mounting portion is attached to the holding portion 122Y. Still, the process of attaching the thermistor element mounting portion can be easily performed.

Moreover, in the present embodiment, heat of a temperature measurement portion of a measurement target product is, as in the first embodiment, transmitted from the heat collection plate 160Y provided opposite to the thermistor element 140Y, to the thermistor element 140Y through the FPC 110Y (the branched portion 111Y). Thus, the accuracy of temperature measurement can be enhanced.

Further, in the present embodiment, it may only be required that the wirings are provided only on one surface of the FPC 110Y. Thus, the single-sided copper-clad laminate can be used as the material of the FPC 110Y. Consequently, a cost can be reduced as compared to the case of using a double-sided copper-clad laminate.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A temperature measurement device comprising:
   a case fixed to a measurement target product;
   a flexible printed circuit board attached to the case; and
   a thermistor configured to be electrically connected to the flexible printed circuit board,
   wherein the case includes:
      a holding portion configured to hold the thermistor,
      a support portion configured to support the holding portion, and
      a hinge portion configured to connect the holding portion to a case body provided with the support portion, and
   the support portion is configured to engage the holding portion in a configuration that the case is folded towards the support portion at the hinge portion.

2. The temperature measurement device according to claim 1, wherein
   the flexible printed circuit board has multiple wirings, and
   the multiple wirings include a wiring for measuring a voltage of the measurement target product and a wiring connected to the thermistor.

3. The temperature measurement device according to claim 2, wherein
   the wiring for measuring the voltage is provided on a first surface of the flexible printed circuit board,
   the wiring connected to the thermistor is provided on a second surface of the flexible printed circuit board, and
   a heat collection plate is provided on a back side of a portion of the flexible printed circuit board provided with the thermistor.

4. The temperature measurement device according to claim 2, wherein
   the multiple wirings are provided on one surface of the flexible printed circuit board,
   at least one wiring of the multiple wirings provided on the one surface is for measuring the voltage, and the thermistor is connected to a wiring other than the at least one wiring, and
   the temperature measurement device further comprises a spacer for forming a clearance between the measurement target product and the thermistor is provided on the flexible printed circuit board to surround the thermistor.

5. The temperature measurement device according to claim 2, wherein
   multiple wirings are provided on one surface of the flexible printed circuit board,
   at least one wiring of the multiple wirings provided on the one surface is for measuring the voltage, and the thermistor is connected to a wiring other than the at least one wiring,
   the thermistor is connected to a wiring provided on a branched portion branched from a flexible printed circuit board body among the multiple wirings for measuring the voltage,
   the thermistor is held by the holding portion with the branched portion being folded back, and
   a heat collection plate is provided on a back side of a portion of the branched portion of the flexible printed circuit board provided with the thermistor.

6. A temperature measurement device comprising:
   a case configured to be fixed to a measurement target product;
   a flexible printed circuit board attached to a first surface of the case; and a thermistor configured to be electrically connected to the flexible printed circuit board, wherein the case includes:
- a holding portion disposed on the first surface of the case, the holding portion being configured to hold the thermistor;
- a support portion disposed on a second surface of the case opposite the first surface; and
- a hinge portion interposed between the holding portion and a portion of the case attached to the flexible printed circuit board, and the support portion is configured to engage the holding portion to extend the holding portion in a direction away from the second surface in a configuration that the second surface is folded over at the hinge portion.

* * * * *